(12) United States Patent
Maeda et al.

(10) Patent No.: US 7,619,550 B2
(45) Date of Patent: Nov. 17, 2009

(54) DELTA-SIGMA AD CONVERTER APPARATUS USING DELTA-SIGMA MODULATOR CIRCUIT PROVIDED WITH RESET CIRCUIT RESETTING INTEGRATOR

(75) Inventors: Tomoaki Maeda, Hiroshima (JP); Taiji Akizuki, Miyagi (JP); Hisashi Adachi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/100,236

(22) Filed: Apr. 9, 2008

(65) Prior Publication Data

US 2008/0252502 A1 Oct. 16, 2008

(30) Foreign Application Priority Data

Apr. 10, 2007 (JP) .............................. 2007-102454

(51) Int. Cl.
 *H03M 3/00* (2006.01)
(52) U.S. Cl. ...................... 341/143; 341/155
(58) Field of Classification Search .......... 341/143–155
See application file for complete search history.

(56) References Cited

U.S. PATENT DOCUMENTS 5,012,244 A * 4/1991 Wellard et al. .............. 341/143
5,977,895 A * 11/1999 Murota et al. ............... 341/143
6,061,009 A * 5/2000 Krone et al. ................ 341/143
6,064,326 A * 5/2000 Krone et al. ................ 341/143
6,362,763 B1 * 3/2002 Wang ......................... 341/143
6,489,907 B2 * 12/2002 Cusinato et al. ............. 341/143
6,765,520 B1 * 7/2004 Chuang et al. .............. 341/143
6,768,436 B1 * 7/2004 Chuang ...................... 341/143

FOREIGN PATENT DOCUMENTS

JP     2002-118431     4/2002

* cited by examiner

*Primary Examiner*—Lam T Mai
(74) *Attorney, Agent, or Firm*—Wenderoth, Lind & Ponack, L.L.P.

(57) ABSTRACT

In a delta-sigma modulator circuit, an integrator integrates an input signal, and a quantization circuit quantizes the integrated signal with a predetermined quantization number, and outputs a quantization result signal. A DA converter circuit outputs an analog signal indicating a DA conversion result based on the quantization result signal. An oscillation detector circuit detects that the integrator is in an oscillation state based on the integrated signal, and outputting an oscillation detection signal. A reset circuit resets the integrator based on the oscillation detection signal.

12 Claims, 4 Drawing Sheets

DELTA-SIGMA AD CONVERTER APPARATUS 50

DELTA-SIGMA AD CONVERTER APPARATUS USING DELTA-SIGMA MODULATOR CIRCUIT PROVIDED WITH RESET CIRCUIT RESETTING INTEGRATOR

BACKGROUND OF THE INVENTION

1. Field of the Invention

The present invention relates to a delta-sigma modulator circuit and a delta-sigma AD converter apparatus using a delta-sigma modulator circuit, and in particular, to delta-sigma modulator circuit and a delta-sigma AD converter apparatus using a delta-sigma modulator circuit provided with a reset circuit for resetting an integrator of the delta-sigma modulator circuit.

2. Description of the Related Art

For a delta-sigma modulator circuit and a delta-sigma AD converter apparatus using the delta-sigma modulator circuit according to the prior art, it is necessary to increase the order of a filter so as to obtain a high signal-to-noise ratio (referred to an SNR hereinafter). However, if the order of the filter is higher, the operation becomes more unstable, with the result that oscillation tends to occur more easily. Even if the operation is stable in a design phase based on simulation, oscillation often occurs when unexpectedly high-level signals are inputted in a practical phase. Moreover, once an oscillation occurs, the oscillation often continues even if a signal input level returns into an input level design range. In this case, it is necessary to appropriately reset the circuit or apparatus.

The Japanese patent laid-open publication No. JP-2002-118431-A discloses a method of detecting an oscillation and a method of suppressing the oscillation in a delta-sigma modulator circuit. The delta-sigma modulator circuit includes a switching amplifier. In the switching amplifier, a semiconductor power amplifier device provided in a constant voltage switch operates in a saturation range in response to a one-bit signal obtained by a delta-sigma modulation, and executes switching of a high voltage supplied from a power source, and the same signal is passed through a low-pass filter (referred to as an LPF hereinafter) to be smoothed. This leads to amplification of an audio signal with a higher efficiency. In order to detect oscillation of the delta-sigma modulator circuit and to prevent breakdown of the semiconductor power amplifier device, the switching amplifier is configured as follows. A pulse count circuit measures a time interval for which high-level or low-level one-bit signals are continuously input by counting pulses of clock signals supplied from a clock generator circuit that defines a timing of the one-bit signal. When the number of one-bit signals is equal to or greater than a predetermined threshold value, a power-off circuit is actuated to shut down a power line to the constant voltage switch.

With the method of detecting an oscillation in the delta-sigma modulator circuit according to the prior art configured as stated above, high-level signals are continuously generated during an oscillation. Due to this, the number of signals is measured and it is considered that the delta-sigma modulator circuit is in an "oscillation state" when the number of signals exceeds the predetermined threshold value. Therefore, it is disadvantageously necessary to prepare a counter counting signals, and it disadvantageously takes relatively long time to measure the number of signals and to detect occurrence of an oscillation. On the other hand, the method according to the prior art has the following problems. It is possibly erroneously determined that the delta-sigma modulator circuit is in the "oscillation state" even when low-frequency signals are inputted if the threshold value is inappropriately set.

SUMMARY OF THE INVENTION

It is an object of the present invention to provide a delta-sigma modulator circuit and a delta-sigma AD converter apparatus using the delta-sigma modulator circuit, which are capable of solving the above-stated problems, and promptly detecting an oscillation state with a simple configuration as compared with the prior art.

According to the first aspect of the present invention, there is provided a delta-sigma modulator circuit including an integrator for integrating an input signal, a quantization circuit, and a DA converter circuit. The quantization circuit quantizes the integrated signal with a predetermined quantization number, and outputs a quantization result signal. The DA converter circuit outputs an analog signal indicating a DA conversion result based on the quantization result signal. The quantization circuit further includes an oscillation detector circuit for detecting that the integrator is in an oscillation state based on the integrated signal, and outputting an oscillation detection signal. The delta-sigma modulator circuit further includes a reset circuit for resetting the integrator based on the oscillation detection signal.

In the above-mentioned delta-sigma modulator circuit, the quantization circuit includes a plurality of quantizers corresponding to the quantization number. The oscillation detector circuit includes an excessively high input detection quantizer, an excessively low input detection quantizer, a signal generator circuit. The excessively high input detection quantizer detects that the integrated signal is equal to or higher than a first threshold value that is an excessively high input threshold value, and outputting an excessively high input detection signal. The excessively low input detection quantizer detects that the integrated signal is lower than a second threshold value that is an excessively low input threshold value, and outputting an excessively low input detection signal. The signal generator circuit generates the oscillation detection signal based on the excessively high input detection signal and the excessively low input detection signal.

In addition, in the above-mentioned delta-sigma modulator circuit, the reset circuit discharges electric charges accumulated in an integral capacitor included in the integrator.

Further, in the above-mentioned delta-sigma modulator circuit, an operational amplifier included in the integrator is turned into a sleep state based on the oscillation detection signal.

Still further, in the above-mentioned delta-sigma modulator circuit, electric charges accumulated in a sampling capacitor included in the integrator are discharged based on the oscillation detection signal.

Still further, in the above-mentioned delta-sigma modulator circuit, electric charges accumulated in a sampling capacitor included in the DA converter circuit are discharged based on the oscillation detection signal.

According to the second aspect of the present invention, there is provided a delta-sigma AD converter apparatus for performing a delta-sigma AD conversion on an input signal. The delta-sigma AD converter apparatus includes the delta-sigma modulator circuit.

Therefore, the delta-sigma modulator circuit and the delta-sigma AD converter apparatus using the delta-sigma modulator circuit according to the present invention can promptly detect an oscillation state with a simpler configuration than that of the prior art when unexpectedly high or low-level signals are inputted, that is, can efficiently detect the oscillation state of an integrator in the delta-sigma modulator circuit, and return the delta-sigma modulator circuit to a normal operation.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 3(a) is a waveform view showing an integral output voltage INO outputted from an integrator 1; FIG. 3(b) is a waveform view showing an excessively high input detection signal OH generated by an oscillation detector circuit 2 provided with a quantizer; FIG. 3(c) is a waveform view showing an excessively low input detection signal OL generated by the oscillation detector circuit 2 provided with the quantizer; and FIG. 3(d) is a waveform view showing an oscillation detection signal OD outputted from the oscillation detector circuit 2 provided with the quantizer.

DETAILED DESCRIPTION OF THE PREFERRED EMBODIMENTS

Preferred embodiments of the present invention will be described hereinafter with reference to the accompanying drawings. In the following preferred embodiments, similar constituent elements are denoted by the same reference symbols.

Figure 1:
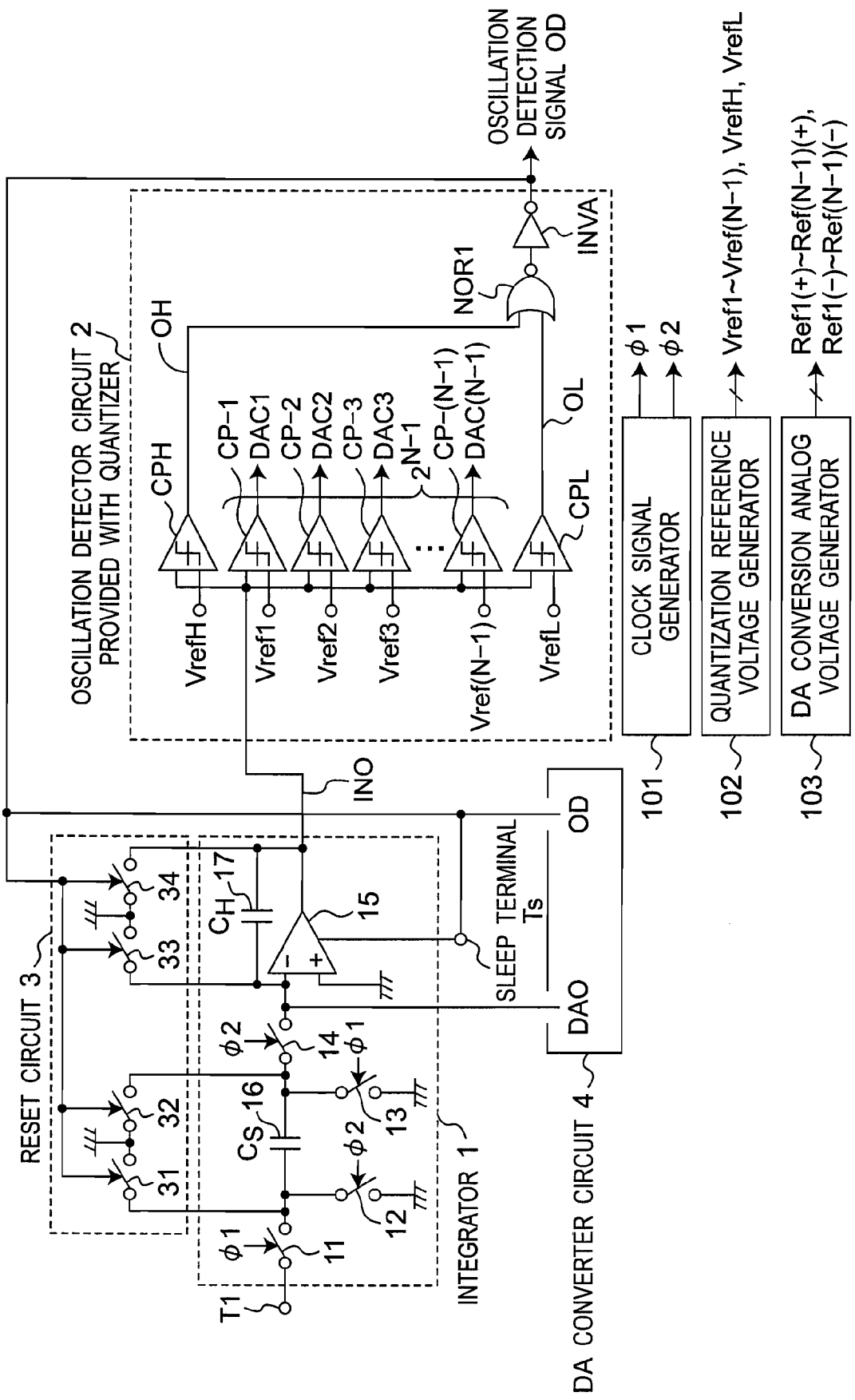
FIG. 1 is a circuit diagram showing a configuration of a first part of a delta-sigma modulator circuit 100 according to a preferred embodiment of the present invention.
Figure 2:
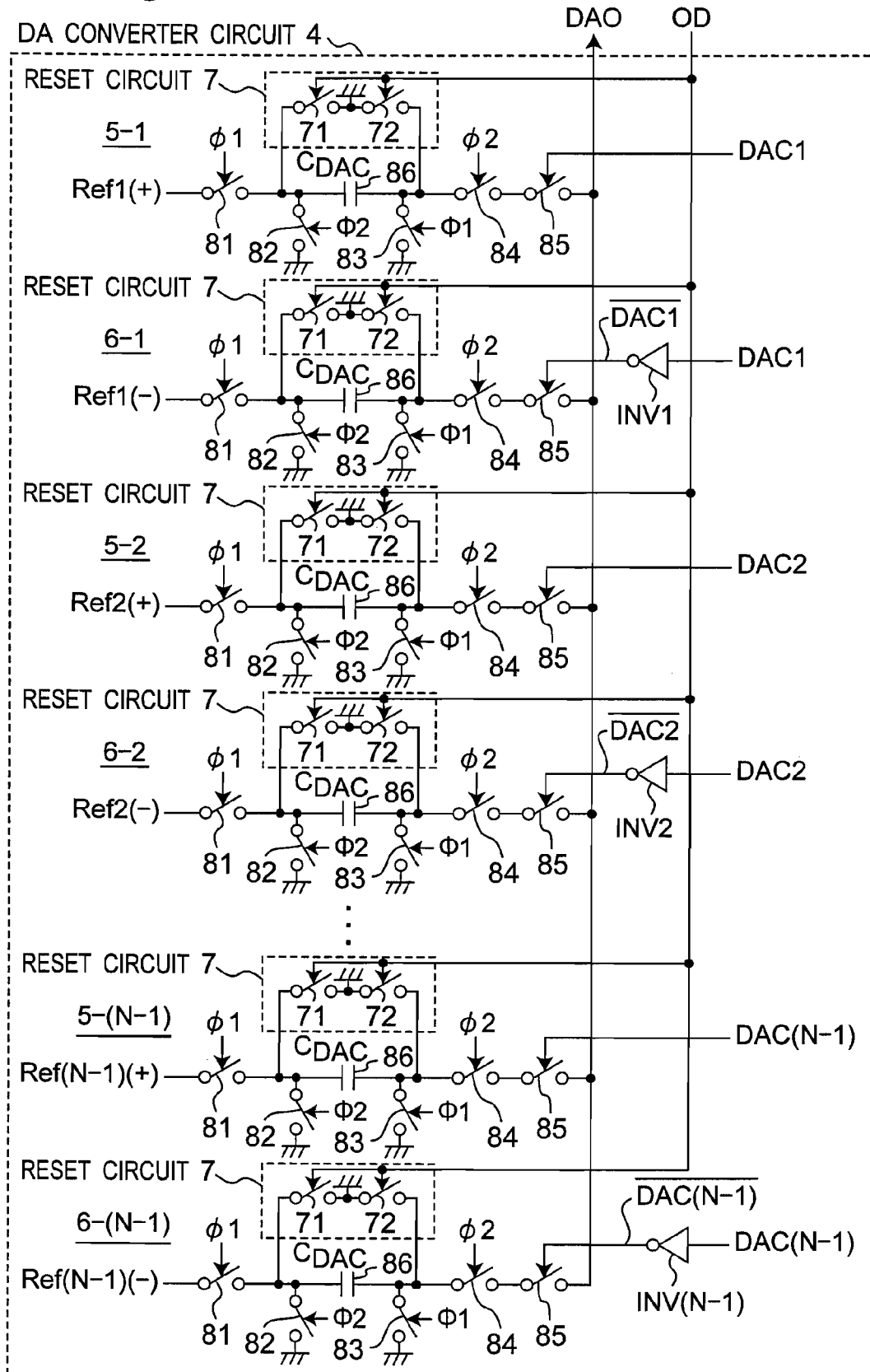
FIG. 2 is a circuit diagram showing a configuration of a second part of the delta-sigma modulator circuit 100 shown in FIG. 1.

FIGS. 1 and 2 are circuit diagrams showing a configuration of a delta-sigma modulator circuit 100 according to one preferred embodiment of the present invention. As shown in FIG. 1, the delta-sigma modulator circuit 100 according to the present preferred embodiment includes:

(a) an integrator 1, which integrates a signal input via an input terminal T1, and outputting an integral output voltage INO;

(b) an oscillation detector circuit 2 provided with a quantizer, which quantizes the integral output signal INO with a predetermined quantization number (or quantization bit rate) N, and outputs quantization result signals DAC1 to DAC(N-1); and (c) a DA converter circuit 4, which outputs an analog signal DAO indicating a DA conversion result based on the quantization result signals DAC1 to DAC(N-1).

The delta-sigma modulator circuit 100 is characterized in that:

(d) the oscillation detector circuit 2 provided with a quantizer further detects that the integrator 1 is in an oscillation state based on the integral output voltage INO, and outputs an oscillation detection signal OD, and (e) reset circuits 3 and 7 reset the operations of the integrator 1 and the DA converter circuit 4 based on the oscillation detection signal OD, respectively.

Referring to FIGS. 1 and 2, the configuration and operation of the delta-sigma modulator circuit 100 will be next described.

As shown in FIG. 1, the oscillation detector circuit 2 provided with the quantizer is configured to include the following:

(a) in addition to (N-1) quantizers CP-1 to CP-(N-1), which perform quantization processes using quantization reference voltages Vref1 to Vref(N-1) based on a predetermined quantization number N for the delta-sigma modulator circuit 100; a quantizer CPH which detects an excessively high input voltage equal to or higher than an excessively high input threshold value VrefH, and a quantizer CPL which detects an excessively low input voltage lower than an excessively low input threshold value VrefL;

(b) a NOR gate NOR1; and (c) an inverter INVA.

The integral output voltage INO outputted from the integrator 1 is inputted to first input terminals of the respective quantizers CP-1 to CP-(N-1), CPH and CPL. The quantization reference voltages Vref1 to Vref(N-1) and the excessively high input threshold value VrefH and the excessively low input threshold value VrefL are generated by a quantization reference voltage generator 102, and then, are inputted to second input terminals of the respective quantizers CP-1 to CP-(N-1), CPH, and CPL. Each of the quantizers CP-1 to CP-(N-1), CPH, and CPL compares the voltage inputted to the first input terminal with the quantization reference voltage or the threshold value inputted to the second input terminal. If the voltage inputted to the first input terminal is equal to or higher than the quantization reference voltage or the threshold value inputted to the second input terminal, each of the quantizers CP-1 to CP-(N-1), CPH, and CPL outputs a high-level comparison result signal, otherwise, each of the quantizers CP-1 to CP-(N-1), CPH, and CPL outputs a low-level comparison result signal. The comparison result signal OH from the quantizer CPH is inputted to the inverter INVA via the NOR gate NOR1. The comparison result signal OL from the quantizer CPL is inputted to the inverter INVA via the NOR gate NOR1. Further, comparison result signals DAC1 to DAC(N-1) from the quantizers CP-1 to CP-(N-1) are applied to switches 85 of the DA converter circuit 4 shown in FIG. 2 as control signals, respectively. The inverter INVA inverts the input signals to obtain an oscillation detection signal OD, and applies the oscillation detection signal OD to switches 31 to 34 of the reset circuit 3, a sleep terminal Ts of an operational amplifier 15 included in the integrator 1, and switches 71 and 72 of the reset circuit 7 included in the DA converter circuit 4 shown in FIG. 2 as a control signal.

The integrator 1 is configured to include a well-known switched capacitor filter. Specifically, the integrator 1 is configured to include switches 11 and 13 turned on or off based on a clock signal φ1, switches 12 and 14 turned on or off based on a clock signal φ2, a sampling capacitor 16 including a sampling capacity $C_s$, an integral capacitor 17 including an integral capacity $C_H$ that is a feedback capacity, and the operational amplifier 15 having the sleep terminal Ts. The reset circuit 3 resetting the operation of the integrator 1 is provided to correspond to the integrator 1. It is to be noted that the clock signals φ1 and φ2 inverted with respect to each other are generated by a clock signal generator 101.

The reset circuit 3 is configured to include the four switches 31 to 34 turned on based on the high-level oscillation detection signal OD. If each of the switches 31 to 34 is turned on, then the switch 31 grounds one end of the sampling capacitor 16, the switch 32 grounds another end of the sampling capacitor 16, to discharge the electric charges (referred to as charges hereinafter) accumulated in the sampling capacitor 16. Further, the switch 33 grounds one end of the integral capacitor 17 and the switch 34 grounds another end of the integral capacitor 17, and this leads to discharging of charges accumulated in the integral capacitor 17. By thus discharging the charges, the integrator 1 is reset.

A DA conversion analog voltage generator 103 generates predetermined DA conversion analog voltages Ref1(+) to Ref(N-1)(+) and Ref1(−) to Ref(N-1)(−), and outputs the DA conversion analog voltages Ref1(+) to Ref(N-1)(+) and Ref1(−) to Ref(N-1)(−) to the respective switches 81 of the DA converter circuit 4. The former is positive analog voltages, and the latter is negative analog voltages.

The DA converter circuit 4 shown in FIG. 2 is configured to include (N-1) DA converters 5-n (n=1, 2, . . . , N-1) for positive analog voltage each constituted by a switched capacitor filter, (N-1) DA converters 6-n (n=1, 2, . . . , N-1) for negative analog voltage each constituted by a switched capacitor filter, and (N-1) inverters INV1 to INV(N-1). The DA converters 5-n and 6-n (n=1, 2, . . . , N-1) are configured similarly. Specifically, each of the DA converters 5-n and 6-n is configured to include switches 81 and 83 turned on or off based on the clock signal φ1, switches 82 and 84 turned on or off based on the clock signal φ2, a sampling capacitor 86, and a switch 85 turned on or off based on each of the comparison result signals DAC1 to DAC(N-1), $\overline{DAC1}$ to $\overline{DAC(N-1)}$, where over-barred signals represent inverted signals. The reset signals 7 for resetting the operation of the DA converters 5-n and 6-n (n=1, 2, . . . , N-1) are provided to correspond to the respective DA converters 5-n and 6-n. The clock signals φ1 and φ2 inverted from each other are generated by the clock signal generator 101. Further, the comparison result signals DAC1 to DAC(N-1) are applied to the switches 85 of the respective positive analog voltage DA converters 5-n, and also applied to the switches 85 of the negative analog voltage DA converters 6-n as the inverted signals $\overline{DAC1}$ to $\overline{DAC(N-1)}$ with respect to the signals DAC1 to DAC(N-1) via the inverters INV1 to INV(N-1), respectively.

Each of the reset circuits 7 is configured to include two switches 71 and 72 turned on based on the high-level oscillation detection signal OD. If each of the switches 71 and 72 is turned on, then the switch 71 grounds one end of the sampling capacitor 86 and the switch 72 grounds another end of the sampling capacitor 86, and this leads to discharging of the charges accumulated in the sampling capacitor 86. By thus discharging the charges, the operation of the DA converter circuit 4 including the DA converters 5-n and 6-n is reset.

Figure 3:
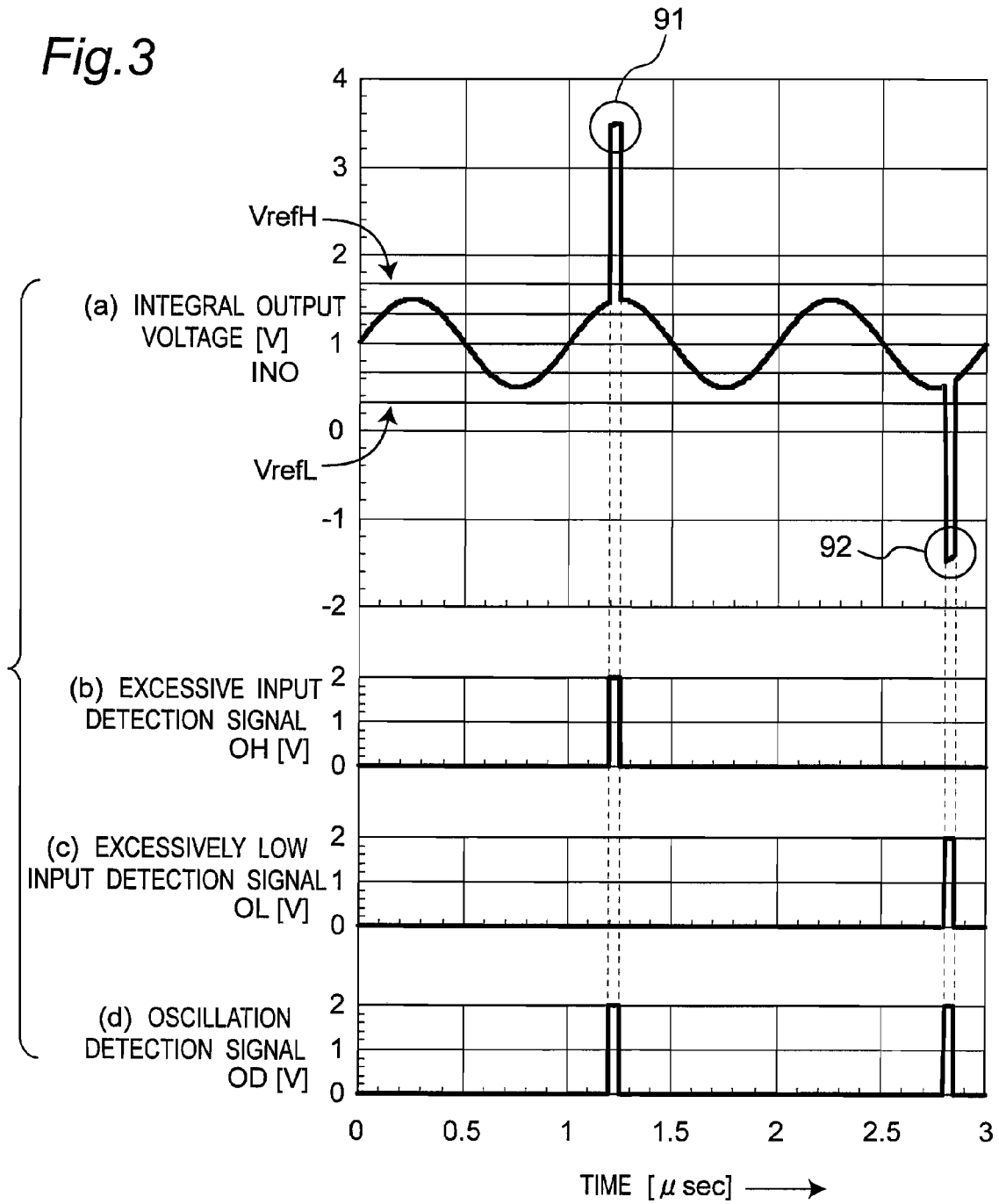
FIG. 3 shows an operation performed by the delta-sigma modulator circuit 100 shown in FIG. 1, where

FIG. 3 shows an operation performed by the delta-sigma modulator circuit 100 shown in FIG. 1. FIG. 3(a) is a waveform view showing the integral output voltage INO outputted from the integrator 1. FIG. 3(b) is a waveform view showing the excessively high input detection signal OH generated by the oscillation detector circuit 2 provided with a quantizer. FIG. 3(c) is a waveform view showing the excessively low input detection signal OL generated by the oscillation detector circuit 2 provided with the quantizer. FIG. 3(d) is a waveform view showing the oscillation detection signal OD outputted from the oscillation detector circuit 2 provided with the quantizer.

Referring to FIG. 3, a reset operation performed by the delta-sigma modulator circuit 100 configured as stated above will be next described. In FIG. 3, if the integral output voltage INO of the integrator 1 is equal to or higher than the excessive threshold value VrefH (as indicated by 91 in FIG. 3(a)) or lower than the excessively low threshold value VrefL (as indicated by 92 in FIG. 3(a)), the oscillation detector circuit 2 provided with the quantizer outputs the high-level oscillation detection signal OD to the reset circuits 3 and 7. By discharging the charges accumulated in the sampling capacitor 16 and the integral capacitor 17, the operation of the integrator 1 can be reset. Further, by discharging the charges accumulated in the sampling capacitor 86, the operation of the DA converter circuit 4 can be reset. Since the high-level oscillation detection signal OD is inputted to the sleep terminal Ts of the operational amplifier 15, the operational amplifier 15 can be turned into a sleep state (i.e., standby state) with lower power than that used in a normal operative state.

In the delta-sigma modulator circuit 100 configured as stated above, the oscillation detector circuit 2 provided with a quantizer can be configured quite simply by adding only the two quantizers CPH and CPL and the NOR gate NOR1, and the inverter INVA to the ordinary quantizers CP-1 to CP-(N-1). Namely, the quantizers CPH and CPL for oscillation detection may be configured identically with the original quantizers CP-1 to CP-(N-1) and there is no need to newly design circuits. This can reduce a period for designing the circuits. Moreover, the quantizers CPH and CPL for oscillation detection do not need to exhibit high performance, so that area and current consumption can be reduced. Besides, the operational amplifier 15 can be turned into the sleep state during the oscillation detection, and this leads to reduction in the power consumption.

Figure 4:
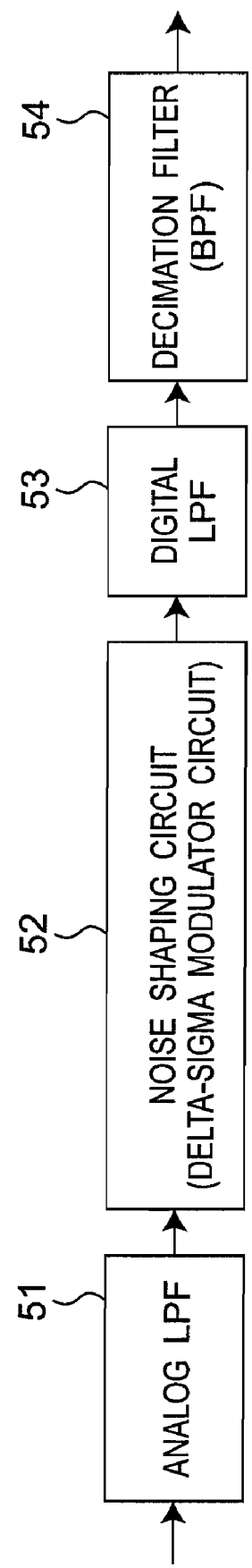
FIG. 4 is a block diagram showing a configuration of a delta-sigma AD converter apparatus 50 using the delta-sigma modulator circuit 100 shown in FIG. 2.

FIG. 4 is a block diagram showing a configuration of a delta-sigma AD converter apparatus 50 using the delta-sigma modulator circuit 100 shown in FIG. 1. Referring to FIG. 4, the delta-sigma AD converter apparatus 50 is configured to include an analog low-pass filter (LPF) 51, a noise shaping circuit 52 using the delta-sigma modulator circuit 100 shown in FIGS. 1 and 2, and a decimation filter 54. Although the delta-sigma AD converter apparatus 50 shown in FIG. 4 has a well-known configuration, the delta-sigma AD converter apparatus 50 characteristically includes the noise shaping circuit 52 using the delta-sigma modulator circuit 100.

As stated so far in detail, the delta-sigma modulator circuit 100 and the delta-sigma AD converter apparatus 50 using the delta-sigma modulator circuit 100 according to the present invention can promptly detect an oscillation state with a simpler configuration than that of the prior art when unexpectedly high or low-level signal is inputted, that is, it can efficiently detect the oscillation state of the integrator 1 of the delta-sigma modulator circuit 100, and then, return the delta-sigma modulator circuit 100 to the normal operation.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A delta-sigma modulator circuit comprising:
    an integrator for integrating an input signal;
    a quantization circuit for quantizing the integrated signal with a predetermined quantization number, and outputting a quantization result signal; and
    a DA converter circuit for outputting an analog signal indicating a DA conversion result based on the quantization result signal,
    wherein the quantization circuit further comprises an oscillation detector circuit for detecting that the integrator is in an oscillation state based on the integrated signal, and outputting an oscillation detection signal, and
    wherein the delta-sigma modulator circuit further comprises a reset circuit for resetting the integrator based on the oscillation detection signal.

2. The delta-sigma modulator circuit as claimed in claim 1,
wherein the quantization circuit includes a plurality of quantizers corresponding to the predetermined quantization number,
wherein the oscillation detector circuit includes:
an excessively high input detection quantizer for detecting that the integrated signal is equal to or higher than a first threshold value that is an excessively high input threshold value, and outputting an excessively high input detection signal;
an excessively low input detection quantizer for detecting that the integrated signal is lower than a second threshold value that is an excessively low input threshold value, and outputting an excessively low input detection signal; and
a signal generator circuit for generating the oscillation detection signal based on the excessively high input detection signal and the excessively low input detection signal.

3. The delta-sigma modulator circuit as claimed in claim 1,
wherein the reset circuit discharges electric charges accumulated in an integral capacitor included in the integrator.

4. The delta-sigma modulator circuit as claimed in claim 2,
wherein the reset circuit discharges electric charges accumulated in an integral capacitor included in the integrator.

5. The delta-sigma modulator circuit as claimed in claim 1, further comprising:
an operational amplifier included in the integrator which is turned into a sleep state based on the oscillation detection signal.

6. The delta-sigma modulator circuit as claimed in claim 2, further comprising:
an operational amplifier included in the integrator which is turned into a sleep state based on the oscillation detection signal.

7. The delta-sigma modulator circuit as claimed in claim 1, further comprising:
a sampling capacitor included in the integrator, wherein electric charges accumulated in the sampling capacitor are discharged based on the oscillation detection signal.

8. The delta-sigma modulator circuit as claimed in claim 2, further comprising:
a sampling capacitor included in the integrator, wherein electric charges accumulated in the sampling capacitor are discharged based on the oscillation detection signal.

9. The delta-sigma modulator circuit as claimed in claim 1, further comprising:
a sampling capacitor included in the DA converter circuit, wherein electric charges accumulated in the sampling capacitor are discharged based on the oscillation detection signal.

10. The delta-sigma modulator circuit as claimed in claim 1, further comprising:
a sampling capacitor included in the DA converter circuit, wherein electric charges accumulated in the sampling capacitor are discharged based on the oscillation detection signal.

11. A delta-sigma AD converter apparatus for performing a delta-sigma AD conversion on an input signal, the delta-sigma AD converter apparatus comprising a delta-sigma modulator circuit,
wherein a delta-sigma modulator circuit comprises:
an integrator for integrating an input signal;
a quantization circuit for quantizing the integrated signal with a predetermined quantization number, and outputting a quantization result signal; and
a DA converter circuit for outputting an analog signal indicating a DA conversion result based on the quantization result signal,
wherein the quantization circuit further comprises an oscillation detector circuit for detecting that the integrator is in an oscillation state based on the integrated signal, and outputting an oscillation detection signal, and
wherein the delta-sigma modulator circuit further comprises a reset circuit for resetting the integrator based on the oscillation detection signal.

12. The delta-sigma AD converter apparatus as claimed in claim 11,
wherein the quantization circuit includes a plurality of quantizers corresponding to the predetermined quantization number,
wherein the oscillation detector circuit includes:
an excessively high input detection quantizer for detecting that the integrated signal is equal to or higher than a first threshold value that is an excessively high input threshold value, and outputting an excessively high input detection signal;
an excessively low input detection quantizer for detecting that the integrated signal is lower than a second threshold value that is an excessively low input threshold value, and outputting an excessively low input detection signal; and
a signal generator circuit for generating the oscillation detection signal based on the excessively high input detection signal and the excessively low input detection signal.

* * * * *